United States Patent
Kerber

[11] Patent Number: 6,090,665
[45] Date of Patent: Jul. 18, 2000

[54] METHOD OF PRODUCING THE SOURCE REGIONS OF A FLASH EEPROM MEMORY CELL ARRAY

[75] Inventor: Martin Kerber, München, Germany

[73] Assignee: Siemens Aktiengesellschaft, Munich, Germany

[21] Appl. No.: 09/044,542

[22] Filed: Mar. 19, 1998

Related U.S. Application Data

[63] Continuation of application No. PCT/DE96/01696, Sep. 19, 1996.

[30] Foreign Application Priority Data

Sep. 19, 1995 [DE] Germany .......................... 195 34 778

[51] Int. Cl.⁷ ................................................. H01L 21/336
[52] U.S. Cl. ........................................... 438/257; 438/259
[58] Field of Search ..................... 438/257, 258, 438/259, 263, 264

[56] References Cited

U.S. PATENT DOCUMENTS

| | | |
|---|---|---|
| 4,513,397 | 4/1985 | Ipri et al. . |
| 4,990,979 | 2/1991 | Otto . |
| 5,661,057 | 8/1997 | Fujiwara .................................. 438/257 |
| 5,807,778 | 9/1998 | Lee ......................................... 438/257 |
| 5,858,821 | 1/1999 | Dennison et al. ....................... 438/257 |
| 5,861,333 | 1/1999 | Lin .......................................... 438/258 |
| 5,888,870 | 3/1999 | Gardner et al. ......................... 438/263 |
| 5,930,619 | 7/1999 | Noble ...................................... 438/259 |
| 5,930,627 | 7/1999 | Zhou et al. .............................. 438/257 |

FOREIGN PATENT DOCUMENTS 33 08 092 A1   9/1983   Germany .

OTHER PUBLICATIONS

International Publication No. 83/03167 (Angle), dated Sep. 15, 1983.

*Primary Examiner*—John F. Niebling
*Assistant Examiner*—Walter L. Lindsay Jr.
*Attorney, Agent, or Firm*—Herbert L. Lerner; Laurence A. Greenberg; Werner H. Stemer

[57] ABSTRACT

The field insulation in a flash memory cell is provided by an oxide/polysilicon/oxide sandwich. The memory cell area is reduced by dopant implantation, self-aligned with respect to the word lines of two adjacent memory cells, for producing the source regions and source connections. The field insulation produces a capacitance between the doping region and the polysilicon layer of the insulation layer which improves the read characteristic of the memory cell.

7 Claims, 3 Drawing Sheets

METHOD OF PRODUCING THE SOURCE REGIONS OF A FLASH EEPROM MEMORY CELL ARRAY

CROSS-REFERENCE TO RELATED APPLICATION

This is a continuation of copending international application PCT/DE96/01696, filed Sep. 19, 1996, which designated the United States.

BACKGROUND OF THE INVENTION

Field of the Invention

The surface of a semiconductor substrate in the production of conventional flash EEPROM memory cells is oxidized locally, i.e., the drain, channel and source regions as wel as the source terminal tracks are left exposed. The gate region is thereafter thermally oxidized and the floating gate is formed on the gate oxide. An insulation layer is formed on the floating gate, and the control-gate electrode is applied over the insulation layer. In that case, the control-gate electrode is used as a word line and it extends over the floating gates of many adjacent memory cells. The memory cells are respectively arranged in pairs along a direction perpendicular to the word lines, such that their drain regions are adjacent and they each have a common drain terminal. The source terminals of all the memory cells are connected to one another by connections parallel to the word lines. That configuration is referred to as a NOR circuit.

In a subsequent production step, the control-gate electrode is used as a mask for doping of the drain and source regions which is self-aligned with respect to this electrode. The distance between the source connections and the word lines, which extend parallel to one another, is thereby determined by the field-oxide edge and the alignment inaccuracies in the production of the word lines.

The distance between the word lines of two adjacent memory cells can be reduced, as suggested in the prior art, in that they are used for the self-aligned implantation of the source regions located between them.

However, the resistance of such a source region and the source connections located between the word lines is relatively high, which renders a memory cell with a poor read characteristic.

An EEPROM in which each cell has its own source and drain region, and a process for the production thereof, is disclosed by U.S Pat. No. 4,513,397 to Ipri et al. There, the surface of the substrate is likewise first locally oxidized, in order to define the position of the individual memory cells. Word lines extend over the channel regions of adjacent memory cells and form the control gates. A polysilicon track, which has an interruption only over a sub-region of the respective channel regions, extends below each of the word lines. A floating electrode, arranged between the word lines and the polysilicon tracks and used for charge storage, extends through the interruption. The word lines and the polysilicon tracks are electrically connected to one another.

German published patent application DE 33 08 092 A1 discloses a memory cell with a floating gate electrode, in which a polysilicon layer is disposed beneath the floating gate electrode. The polysilicon layer has a recess through which the floating gate electrode extends. However, in that case the polysilicon layer is used as a control-gate electrode.

A memory cell with a floating gate having the features according to DE 33 08 092 A1 and U.S. Pat. No. 4,513,397 is also disclosed by the published international application WO 83/03167. There again, the control gate electrodes are formed either by polysilicon tracks underneath the floating gate electrode or by polysilicon regions disposed above and below the floating gate electrode.

SUMMARY OF THE INVENTION

It is accordingly an object of the invention to provide a method of producing the source regions of a flash EEPROM memory cell array, which overcomes the above-mentioned disadvantages of the prior art devices and methods of this general type and which renders flash memory cells with minimum area per cell and therefore good read characteristic.

With the foregoing and other objects in view there is provided, in accordance with the invention, a method of producing source regions of a flash EEPROM cell array which comprises the following steps:

forming a layer structure on a substrate, the layer structure including a lower silicon oxide layer, a polysilicon layer on the lower silicon layer, and an upper silicon oxide layer on the polysilicon layer;

etching a trench through at least the upper silicon oxide layer and the polysilicon layer and forming a channel region for each cell of a flash EEPROM cell array;

setting a thickness of the lower silicon oxide layer of the cells by thermal oxidation and forming an insulation between the polysilicon layer and the trench;

forming a floating-gate electrode respectively extending into the trench of a cell;

producing an insulation layer on the floating gate electrode of the cells;

forming word lines on the insulation layer which, above the floating-gate electrodes, act as control-gate electrodes;

applying a photomask at least partly covering the word lines and leaving exposed a region between the word lines; and producing source regions with self-alignment between the respective word lines by implanting a dopant.

In accordance with an added feature of the invention, prior to the step of implanting the dopant, the upper silicon layer of the layer structure is removed with self-alignment with respect to the word lines.

In accordance with an additional feature of the invention, the trenches defining the channel regions are very narrow trenches produced by the following steps:

placing a structure with a steep edge on a first layer, depositing a second layer of a given thickness on the structure and surrounding regions of the first layer;

producing a spacer by anisotropically etching the second layer and removing the structure forming the edge, wherein a width of the spacer is substantially equal to the given thickness of the second layer;

oxidizing the first layer laterally adjacent the spacer, with the spacer acting as an oxidation barrier;

subsequently removing the spacer and etching the first layer underneath the spacer with the oxide layer laterally adjacent the spacer acting as an etching mask.

The materials of the first layer, of the second layer, and of the oxide layer are thereby selected such that they can each be etched selectively.

In accordance with again another feature of the invention, the second layer contains silicon nitride and the First layer contains polysilicon.

In accordance with another feature of the invention, the above-mentioned first layer is deposited on the layer structure of the lower silicon oxide layer, the polysilicon layer, and the upper silicon oxide layer, i.e., the first layer is formed on the upper silicon oxide.

In accordance with a concomitant feature of the invention, throughout the process the respectively uppermost layer is used as an etching mask for a respective underlying layer.

In other words, the silicon oxide/polysilicon/silicon oxide sandwich is first formed on the semiconductor substrate for the purpose of field insulation. For doping the source regions and source connections, a resist mask is applied, which leaves exposed the regions between the word lines of a respective word-line pair. The resist mask in this case only has to cover some of the word lines, and therefore does not need to be aligned exactly. The dopant is then implanted, self-aligned with respect to the word lines, by high-energy implantation. If the insulation sandwich is too thick, the silicon oxide above the polysilicon layer can be etched isotropically, likewise with self-alignment, before the implantation.

The polysilicon layer of the insulation sandwich forms a relatively large capacitance with the source region, which is charged quickly and thereby provides a better memory-cell read characteristic. In this case, the polysilicon layer of the insulation sandwich is connected to the respective well potential.

In order to reduce the area of the storage cell further, the trenches in the insulation sandwich structure, which define the channel regions, are made very narrow. The small structure width required for this is, according to the invention, produced not by photolithography but by producing a microstructure as the result of anisotropic etching of a first layer deposited over an edge, and removal of the structure forming the edge. The spacer at the edge which is left over after the structure with the edge has been removed then forms the first mask for the following process sequence.

Other features which are considered as characteristic for the invention are set forth in the appended claims.

Although the invention is illustrated and described herein as embodied in process for producing the source regions of a flash EEPROM memory cell array, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
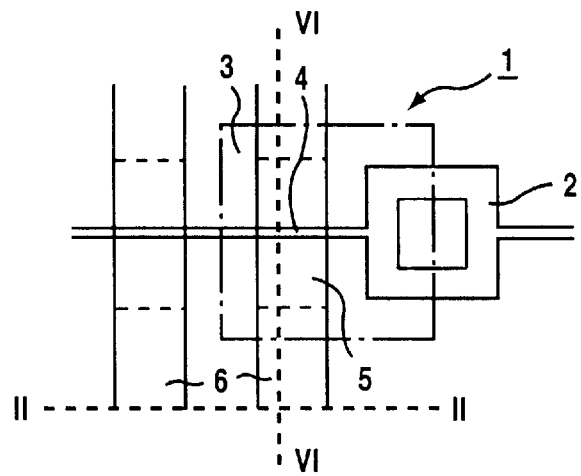
FIG. 1 is a schematic plan view of a flash memory zell produced in a semiconductor substrate.

Referring now to the figures of the drawing in detail and first, particularly, to FIG. 1 thereof, there is seen a flash memory cell 1, produced in accordance with the process according to the invention. The extent of the memory cell 1 is indicated by a dash-dotted line. A drain region 2 and a source region 3 are defined in a semiconductor substrate by implanting dopants. A channel region 4, covered with a floating gate represented by a dashed line, extends between the drain region 2 and the source region 3. The floating gate 5 is in this case insulated by a gate oxide, which is not described in further detail. A further insulation layer, which is also not represented for clarity, is formed over the floating gate 5. A control-gate electrode 6, which simultaneously functions as a word line 6, extends over the insulation layer.

Other memory cells directly adjoin the flash memory cell 1 of FIG. 1 in all directions. The memory cells which are arranged next to one another in the source/channel/drain direction of a memory cell are provided with either a common drain region 2 or a common source region 3. In FIG. 1, the word line 6 of the adjacent memory cell is represented with the same source region 3.

Figure 2:
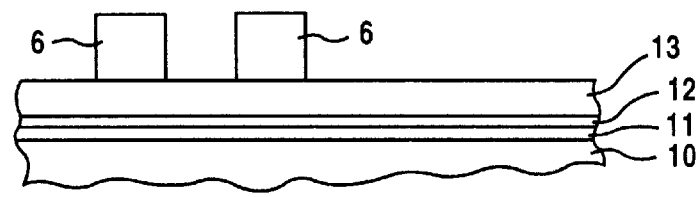
FIG. 2 is a partial sectional view taken along the line II—II in FIG. 1.

Referring now to FIG. 2, a thin oxide layer 11 is formed on a semiconductor substrate 10. A conductive polysilicon layer 12 is applied to this thin oxide layer 11, and a silicon oxide layer 13 is applied to this polysilicon layer. The conductive polysilicon layer 12 acts as a screen. The word lines 6 of two adjacent memory cells are schematically represented on the upper silicon oxide layer 13.

The source regions 3 and the source connections extending between the source regions 3 are to be produced in the region between these word lines 6, by doping in the semiconductor substrate 10.

Figure 3:
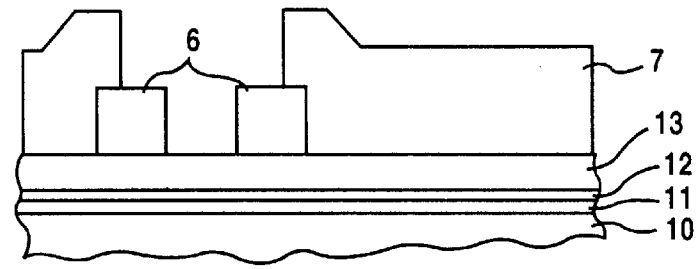
FIGS. 3 and 4 are similar sectional views after further process steps.

To this end, with reference to FIG. 3, a photoresist mask is first formed over the word lines 6 and the upper silicon oxide layer 13. The photoresist layer 7 is structured non-critically with a photolithographic process and removed over the source regions and source connections to be produced. The extent to which the photoresist mask 7 covers the word lines 6 is not critical here. In other words, accurate alignment of the illumination mask is not required here for structuring the photoresist mask 7.

Figure 4:
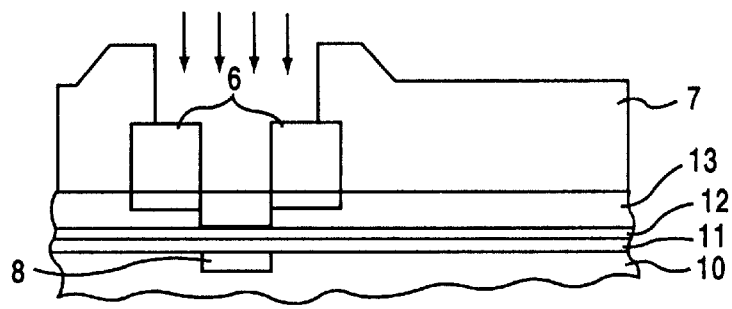

With reference to the arrows in FIG. 4, doped regions 8 are produced in the semiconductor substrate 10 by high-energy implantation of dopants. The doped regions form either the source 3 or source connections, depending on their position. If the insulation sandwich structure 11, 12, 13 is too thick, the upper oxide layer 13 may be etched, likewise wrath self-alignment, before the dopant is implanted.

The doped region 8 and the conductive polysilicon layer 12 form a capacitance which leads to charge storage, which considerably improves the read characteristic of the memory cell, so that the effect of the poor conductivity of the doping region 8 is reduced according to the invention.

FIG. 5A to 5H represent the individual steps in a Production process for producing the trenches for the channel region of a flash memory cell on a semiconductor substrate. In this case, the same layers have the same reference numbers.

Figure 5A:
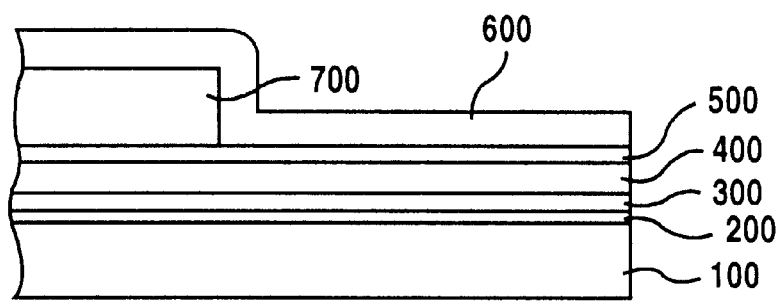
FIGS. 5A to 5H are schematic sectional view illustrating a sequence according to the invention of a production process for the channel of a flash memory cell with an oxide/polysilicon/oxide sandwich insulation.

Referring now to the sequence of FIGS. 5A to 5D, a thin oxide layer 200 has been produced on a semiconductor substrate 100. A doped polysilicon layer 300 has been deposited on the oxide 200 and an oxide layer 400 has been produced on the poly-Si layer 300. Another polysilicon layer 500 has been deposited over the oxide/polysilicon/oxide sandwich insulation layer 200, 300, 400. Then, a TEOS (tetraethyl orthosilicate) layer has been deposited and structured using photolithography so as to produce a steep-edged structure 700. A silicon nitride layer 600 has been deposited over the structure 700 and the free face of the polysilicon layer 500. The result is shown in FIG. 5A.

Figure 5B:
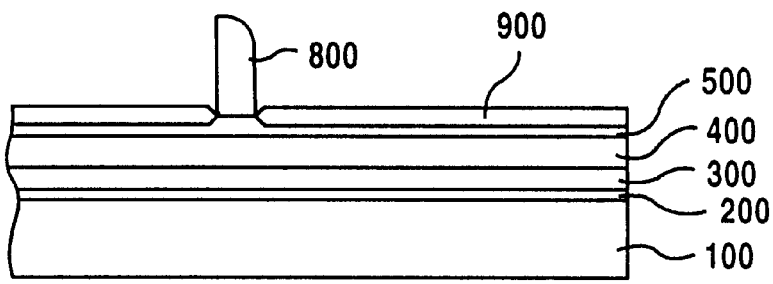

The silicon nitride layer 600 is then etched back anisotropically so that a residue 800 (a so-called spacer) of the silicon nitride layer 600 remains only at the edge of the structure 700. Then, the structure 700 is removed and the underlying polysilicon layer 500 is oxidized. The spacer 800 left at the edge of the structure 700 acts as an oxidation barrier, so that the polysilicon layer 500 is oxidized only around the spacer 800. Accordingly, an oxide layer 900 forms around the spacer 800. The result is shown in FIG. 5B.

The spacer 800 is then removed. In this regard, the spacer 800 must be etchable selectively both with respect to the silicon oxide and with respect to the polysilicon. This condition is met where silicon nitride is used for the first layer. Other materials may, however, also be used. The essential requirement is that they can be etched selectively with respect to one another.

Figure 5C:
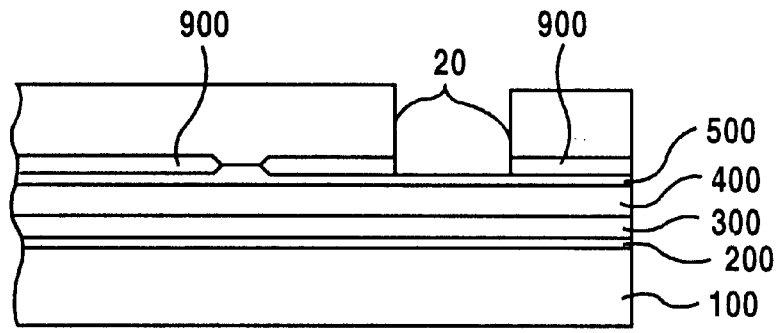
Figure 5D:
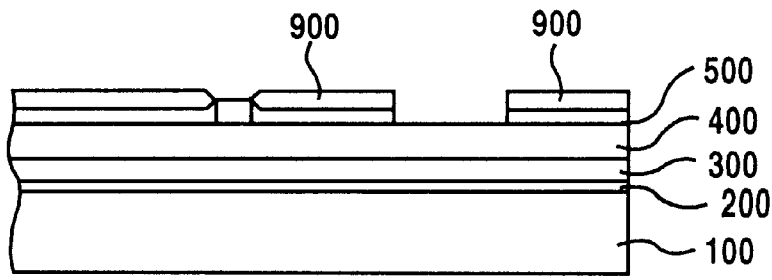

Next, FIG. 5C represents how a further structure can be produced simultaneously with the small structure width in conventional fashion using a photomask 20. The photomask 20 is used for etching regions in the silicon oxide layer 900. After this, the photomask 20 is removed again and the underlying polysilicon 500 is etched anisotropically using the oxide layer 900 which acts as an etching mask. The result is shown in FIG. 5D.

Figure 5E:
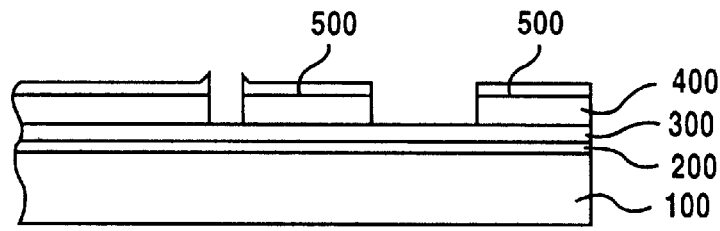

With reference to FIG. 5E, the silicon layer 900 is then etched anisotropically, as a result of which the oxide layer 400 is simultaneously structured.

Figure 5F:
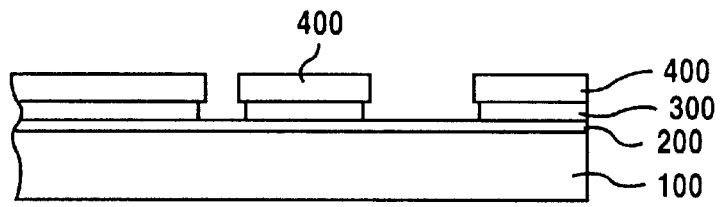

The polysilicon layer 500 is then etched anisotropically. As a result, the polysilicon layer 300 is simultaneously structured. This is shown in FIG. 5F.

Figure 5G:
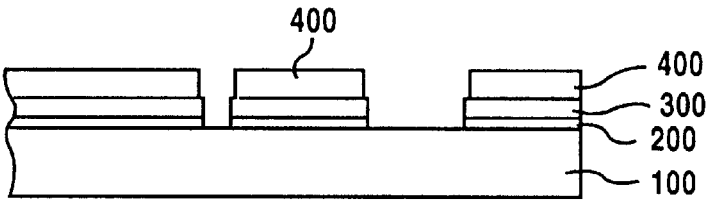
Figure 5H:
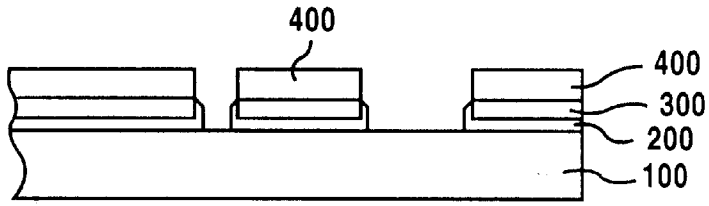

With reference to FIG. 5G, the thin oxide layer 200 is then etched, and the upper oxide layer 400 is also slightly etched. In FIG. 5H, the exposed semiconductor substrate 100 is then thermally oxidized to a desired oxide thickness. The previously exposed edges of the polysilicon layer 200 are thereby covered with an oxide and thus insulated again.

The right-hand portion of FIG. 5H represents a "normal" structure width, which can be produced by a conventional photolithography step. Such a normal structure is required, for example, for the drain regions of the flash memory cells. The left-hand portion shows a very small structure width, as it is produced by the process according to the invention.

Such a narrow structure is particularly advantageous for the channel region of the flash memory cells.

Figure 6:
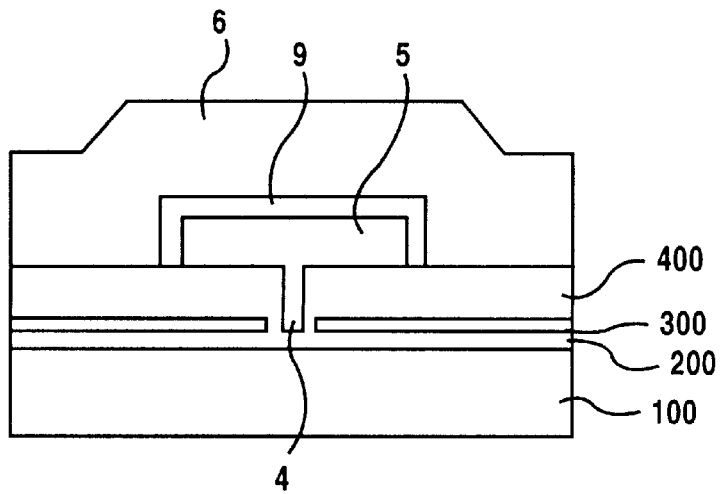
FIG. 6 is a sectional view taken through a flash memory cell along the line VI—VI in FIG. 1, with a narrow channel in an oxide/polysilicon/oxide insulation structure.

Referring now to FIG. 6, wherein identical parts as in the above-described figures are provided with the same reference numerals, production of a flash memory cell requires application of a conductive layer 5 as the floating gate, over which a further conductive layer 6, separated by an insulation layer 9, is deposited as the control gate. By virtue of this small structure width 4, it is possible to produce a very narrow tunnelling region, which permits a high coupling factor. This, in turn, allows for very small programming and erase voltages. Furthermore, the memory cell is smaller because of this small channel width.

We claim:

1. A method of producing source regions of a flash EEPROM cell array which comprises the following steps:

forming a layer structure on a substrate, the layer structure including a lower silicon oxide layer, a polysilicon layer on the lower silicon layer, and an upper silicon oxide layer on the polysilicon layer;

etching a trench through at least the upper silicon oxide layer and the polysilicon layer and forming a channel region for each cell of a flash EEPROM cell array;

setting a thickness of the lower silicon oxide layer of the cells by thermal oxidation and forming an insulation between the polysilicon layer and the trench;

forming a floating-gate electrode respectively extending into the trench of a cell;

producing an insulation layer on the floating gate electrode of the cells;

forming word lines on the insulation layer which, above the floating-gate electrodes, act as control-gate electrodes;

applying a photomask at least partly covering the word lines and leaving exposed a region between the word lines; and producing source regions with self-alignment between the respective word lines by implanting a dopant.

2. The method according to claim 1, which comprises, prior to the step of implanting the dopant, removing the upper silicon layer of the layer structure with self-alignment with respect to the word lines.

3. The method according to claim 1, wherein the trenches defining the channel regions are very narrow trenches produced by:

placing a structure with a steep edge on a first layer, depositing a second layer of a given thickness on the structure and surrounding regions of the first layer;

producing a spacer by anisotropically etching the second layer and removing the structure forming the edge, wherein a width of the spacer is substantially equal to the given thickness of the second layer;

oxidizing the first layer laterally adjacent the spacer, with the spacer acting as an oxidation barrier;

subsequently removing the spacer and etching the first layer underneath the spacer with the oxide layer laterally adjacent the spacer acting as an etching mask.

4. The method according to claim 3, which comprises selecting materials of the first layer, of the second layer, and of the oxide layer such that they can each be etched selectively.

5. The method according to claim 3, wherein the second layer contains silicon nitride and the first layer contains polysilicon.

6. The method according to claim 3, which comprises forming the first layer on the layer structure of the lower silicon oxide layer, the polysilicon layer, and the upper silicon oxide layer.

7. The method according to claim 3, which comprises utilizing a respective uppermost layer as an etching mask for a respective underlying layer.

* * * * *